(12) United States Patent
Oniki

(10) Patent No.: US 10,490,864 B2
(45) Date of Patent: Nov. 26, 2019

(54) DETERIORATION DEGREE CALCULATING METHOD, CONTROL METHOD, AND CONTROL DEVICE FOR LITHIUM ION SECONDARY BATTERY

(71) Applicant: TOYOTA JIDOSHA KABUSHIKI KAISHA, Toyota-shi, Aichi-ken (JP)

(72) Inventor: Motoyuki Oniki, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 635 days.

(21) Appl. No.: 15/164,177

(22) Filed: May 25, 2016

(65) Prior Publication Data

US 2016/0351974 A1    Dec. 1, 2016

(30) Foreign Application Priority Data

May 29, 2015    (JP) ................... 2015-110922

(51) Int. Cl.
*H01M 10/44*    (2006.01)
*H01M 10/42*    (2006.01)
(Continued)

(52) U.S. Cl.
CPC ...... *H01M 10/4285* (2013.01); *G01R 31/367* (2019.01); *G01R 31/382* (2019.01);
(Continued)

(58) Field of Classification Search
CPC ............ G01R 31/3606; G01R 31/3675; G01R 31/3679; H01M 10/00; H01M 10/02; H01M 10/4285; H01M 10/0525; H01M 10/486; H01M 10/056; H01M 10/058; H01M 10/08; H01M 10/42; H01M 10/4228; H01M 10/48; H01M 10/482; H01M 10/484;
(Continued)

(56) References Cited

U.S. PATENT DOCUMENTS

| | | | |
|---|---|---|---|
| 2006/0186890 A1 * | 8/2006 | Iwane | ................ G01R 31/3662 324/426 |
| 2013/0096858 A1 | 4/2013 | Amano et al. | |
| 2013/0099794 A1 | 4/2013 | Takahashi et al. | |

FOREIGN PATENT DOCUMENTS

| | | |
|---|---|---|
| EP | 2804249 B1 | 8/2017 |
| JP | 2013-089424 A | 5/2013 |

(Continued)

*Primary Examiner* — Anthony R Jimenez
(74) *Attorney, Agent, or Firm* — Sughrue Mion, PLLC

(57) ABSTRACT

A temperature history of a lithium ion secondary battery is recorded; a SOC history of the lithium ion secondary battery is recorded; a deterioration degree (K1) of a positive electrode of the lithium ion secondary battery is calculated based on the temperature history, the SOC history, and a first data table; a deterioration degree (K2) of a negative electrode of the lithium ion secondary battery is calculated based on the temperature history, the SOC history, and a second data table; an amount of lithium trapped (TLi) in the lithium ion secondary battery is calculated based on the temperature history, the SOC history, and a third data table; and a deterioration degree of the lithium ion secondary battery is calculated based on the deterioration degree of the positive electrode, the deterioration degree of the negative electrode, and the amount of lithium trapped.

12 Claims, 5 Drawing Sheets

(51) Int. Cl.
  *H01M 10/0525*  (2010.01)
  *H01M 10/48*  (2006.01)
  *G01R 31/382*  (2019.01)
  *G01R 31/392*  (2019.01)
  *G01R 31/367*  (2019.01)
  *G01R 31/374*  (2019.01)

(52) U.S. Cl.
  CPC ...... *G01R 31/392* (2019.01); *H01M 10/0525* (2013.01); *H01M 10/486* (2013.01); *G01R 31/374* (2019.01); *H01M 2010/4292* (2013.01)

(58) Field of Classification Search
  CPC ............... H01M 10/63; H01M 10/633; H01M 2010/4292; H01M 2010/4271; H01M 2010/4278
  USPC .......................................................... 429/50
  See application file for complete search history.

(56) References Cited

FOREIGN PATENT DOCUMENTS

| | | |
|---|---|---|
| JP | 2014-032825 A | 2/2014 |
| JP | 5548784 B2 | 7/2014 |
| KR | 10-2012-0140671 A | 12/2012 |

\* cited by examiner

FIG. 4A

STAND-STILL     M1~M3

M1A

| K1 | | SCC(%) | | | | | |
|---|---|---|---|---|---|---|---|
| | | 0 | 20 | 40 | 60 | 80 | 100 |
| TEMPERATURE (°C) | -30 | 1 | 1 | 1 | 1 | 1 | 1 |
| | 0 | 0.98 | 0.98 | 0.98 | 0.98 | 0.98 | 0.98 |
| | 25 | 0.97 | 0.97 | 0.97 | 0.97 | 0.97 | 0.97 |
| | 60 | 0.9 | 0.9 | 0.9 | 0.9 | 0.9 | 0.9 |

M2A

| K2 | | SCC(%) | | | | | |
|---|---|---|---|---|---|---|---|
| | | 0 | 20 | 40 | 60 | 80 | 100 |
| TEMPERATURE (°C) | -30 | 1 | 1 | 1 | 1 | 1 | 1 |
| | 0 | 0.99 | 0.99 | 0.99 | 0.99 | 0.99 | 0.99 |
| | 25 | 0.98 | 0.98 | 0.98 | 0.98 | 0.98 | 0.98 |
| | 60 | 0.97 | 0.97 | 0.97 | 0.97 | 0.97 | 0.97 |

M3A

| TLi | | SCC(%) | | | | | |
|---|---|---|---|---|---|---|---|
| | | 0 | 20 | 40 | 60 | 80 | 100 |
| TEMPERATURE (°C) | -30 | 0 | 0 | 0 | 0 | 0 | 0 |
| | 0 | -0.1 | -0.1 | -0.1 | -0.1 | -0.1 | -0.1 |
| | 25 | -0.3 | -0.3 | -0.3 | -0.3 | -0.3 | -0.3 |
| | 60 | 0.2 | 0.2 | 0.2 | 0.2 | 0.2 | 0.2 |

FIG. 4B

CURRENT APPLICATION $M1 \sim M3$

M1B

| K1 | | SOC(%) | | | | | |
|---|---|---|---|---|---|---|---|
| | | 0 | 20 | 40 | 60 | 80 | 100 |
| TEMPERATURE (°C) | -30 | 0.8 | 0.9 | 1 | 1 | 0.9 | 0.8 |
| | 0 | 0.79 | 0.89 | 0.99 | 0.99 | 0.89 | 0.79 |
| | 25 | 0.78 | 0.88 | 0.98 | 0.98 | 0.88 | 0.78 |
| | 60 | 0.64 | 0.72 | 0.8 | 0.8 | 0.72 | 0.64 |

M2B

| K2 | | SOC(%) | | | | | |
|---|---|---|---|---|---|---|---|
| | | 0 | 20 | 40 | 60 | 80 | 100 |
| TEMPERATURE (°C) | -30 | 0.8 | 0.9 | 1 | 1 | 0.9 | 0.8 |
| | 0 | 0.79 | 0.89 | 0.99 | 0.99 | 0.89 | 0.79 |
| | 25 | 0.78 | 0.88 | 0.98 | 0.98 | 0.88 | 0.78 |
| | 60 | 0.64 | 0.72 | 0.8 | 0.8 | 0.72 | 0.64 |

M3B

| TLi | | SOC(%) | | | | | |
|---|---|---|---|---|---|---|---|
| | | 0 | 20 | 40 | 60 | 80 | 100 |
| TEMPERATURE (°C) | -30 | 0.2 | 0.1 | 0 | 0 | 0.1 | 0.2 |
| | 0 | 0.21 | 0.11 | 0.01 | 0.01 | 0.11 | 0.21 |
| | 25 | 0.22 | 0.12 | 0.02 | 0.02 | 0.12 | 0.22 |
| | 60 | 0.36 | 0.28 | 0.2 | 0.2 | 0.28 | 0.36 |

DETERIORATION DEGREE CALCULATING METHOD, CONTROL METHOD, AND CONTROL DEVICE FOR LITHIUM ION SECONDARY BATTERY

INCORPORATION BY REFERENCE

The disclosure of Japanese Patent Application No. 2015-110922 filed on May 29, 2015 including the specification, drawings and abstract is incorporated herein by reference in its entirety.

BACKGROUND OF THE INVENTION

1. Field of the Invention

The present invention relates to a deterioration degree calculating method, a control method, and a control device for a lithium ion secondary battery.

2. Description of Related Art

In this specification, "lithium ion secondary battery" refers to a secondary battery in which lithium ions are used as electrolyte ions, and charge and discharge are realized by electrons moving between positive and negative electrodes along with the lithium ions. Here, the form of "lithium ion secondary battery" which is a control target of the control device includes "battery pack" in which plural battery elements are connected to each other. Further, the form of "lithium ion secondary battery" which is a control target of the control device includes a secondary battery which is incorporated into "the battery pack" as a battery element.

As a control method for a lithium ion secondary battery, Japanese Patent Application Publication No. 2013-89424 (JP 2013-89424 A) discloses a method for estimating deterioration of a battery. In the estimation method disclosed in JP 2013-89424 A, a data table for estimating to what degree a battery deteriorates when being left to stand at a temperature in a SOC for a predetermined amount of time, is prepared. In practice, a deterioration degree of the battery is estimated based on a temperature history and a SOC history.

Regarding the method for estimating a deterioration degree of a lithium ion secondary battery, the method disclosed in JP 2013-89424 A can estimate a deterioration degree of a lithium ion secondary battery. However, it is preferable that a difference between a deterioration degree, which is calculated as an estimated value, and an actual deterioration degree of the lithium ion secondary battery is small. Here, a new method capable of accurately estimating a deterioration degree of a lithium ion secondary battery is disclosed.

SUMMARY OF THE INVENTION

A first aspect of the invention is a deterioration degree calculating method for a lithium ion secondary battery including: a) storing a first data table, a second data table, and a third data table in a storing unit, the first data table containing a relationship between a temperature, a SOC, and a deterioration degree of a positive electrode per unit time regarding the lithium ion secondary battery, the second data table containing a relationship between a temperature, a SOC, and a deterioration degree of a negative electrode per unit time regarding the lithium ion secondary battery, and the third data table containing a relationship between a temperature, a SOC, and an amount of lithium trapped per unit time regarding the lithium ion secondary battery; b) recording a temperature history of the lithium ion secondary battery in a recording unit; c) recording a SOC history of the lithium ion secondary battery in the recording unit; d) calculating a deterioration degree of the positive electrode of the lithium ion secondary battery based on the temperature history, the SOC history, and the first data table; e) calculating a deterioration degree of the negative electrode of the lithium ion secondary battery based on the temperature history, the SOC history, and the second data table; f) calculating an amount of lithium trapped in the lithium ion secondary battery based on the temperature history, the SOC history, and the third data table; and g) calculating a deterioration degree of the lithium ion secondary battery based on the deterioration degree of the positive electrode, the deterioration degree of the negative electrode, and the amount of lithium trapped. According to the above-described aspect, a deterioration degree of a lithium ion secondary battery can be more accurately calculated.

A second aspect of the invention is a control method for a lithium ion secondary battery including: a) storing a first data table, a second data table, and a third data table in a storing unit, the first data table containing a relationship between a temperature, a SOC, and a deterioration degree of a positive electrode per unit time regarding the lithium ion secondary battery, the second data table containing a relationship between a temperature, a SOC, and a deterioration degree of a negative electrode per unit time regarding the lithium ion secondary battery, and the third data table containing a relationship between a temperature, a SOC, and an amount of lithium trapped per unit time regarding the lithium ion secondary battery; b) recording a temperature history of the lithium ion secondary battery in a recording unit; c) recording a SOC history of the lithium ion secondary battery in the recording unit; d) calculating a deterioration degree of the positive electrode of the lithium ion secondary battery based on the temperature history, the SOC history, and the first data table; e) calculating a deterioration degree of the negative electrode of the lithium ion secondary battery based on the temperature history, the SOC history, and the second data table; f) calculating an amount of lithium trapped in the lithium ion secondary battery based on the temperature history, the SOC history, and the third data table; g) calculating a deterioration degree of the lithium ion secondary battery based on the deterioration degree of the positive electrode, the deterioration degree of the negative electrode, and the amount of lithium trapped; and h) controlling the lithium ion secondary battery based on the deterioration degree of the lithium ion secondary battery. According to the above-described aspect, deterioration of a lithium ion secondary battery can be suppressed.

A third aspect of the invention is a control device for a lithium ion secondary battery including: a temperature sensor; an arithmetic unit; and a recording unit, wherein the temperature sensor is configured to detect a temperature of a lithium ion secondary battery and to output a detection result, and the arithmetic unit is configured to detect a SOC of the lithium ion secondary battery, record a temperature history, which is based on the temperature detected by the temperature sensor, in a storage device, record a SOC history, which is based on the SOC detected by the SOC detecting unit, in the storage device, calculate a deterioration degree of a positive electrode of the lithium ion secondary battery based on the temperature history and the SOC history, calculate a deterioration degree of a negative electrode of the lithium ion secondary battery based on the temperature history and the SOC history, calculate an amount of lithium trapped in the lithium ion secondary battery based on the temperature history and the SOC history, calculate a deterioration degree of the lithium ion secondary battery based on the deterioration degree of the positive electrode, the deterioration degree of the negative electrode, and the amount of lithium trapped, and output the deterioration degree of the lithium ion secondary battery. According to the above-described aspect, a deterioration degree of a lithium ion secondary battery can be more accurately calculated.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIGS. 4A and 4B are diagrams showing an example of data tables M1 to M3; and

DETAILED DESCRIPTION OF EMBODIMENTS

Figure 1:
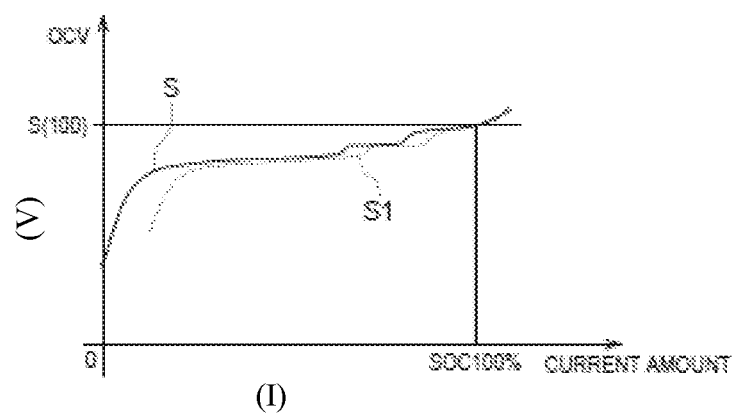
FIG. 1 is a graph showing a typical example of a relationship between a charge current amount and an open-circuit voltage (OCV) of a lithium ion secondary battery 10.

Hereinafter, an embodiment of a deterioration degree calculating method, a control method, and a control device for a lithium ion secondary battery disclosed herein will be described. The embodiment described herein is not intended to limit the invention.

Deterioration of a lithium ion secondary battery described in this specification refers to capacity deterioration of a lithium ion secondary battery. As a lithium ion secondary battery is used, the battery capacity of the lithium ion secondary battery tend to decrease from a battery capacity in an initial state. A deterioration degree of a lithium ion secondary battery is expressed by a ratio of a current battery capacity to a battery capacity in an initial state. That is, a deterioration degree of a lithium ion secondary battery is expressed by the following Expression (A), is a ratio of a current battery capacity to a battery capacity in an initial state, which is 100, and may also be called a capacity retention.

Deterioration Degree of Lithium Ion Secondary Battery=(Current Battery Capacity)/(Battery Capacity in Initial State)×100(%)  (A)

"Initial state" of a lithium ion secondary battery can be arbitrarily determined after the construction of the lithium ion secondary battery. For example, "initial state" may be a state of a lithium ion secondary battery which has undergone a predetermined conditioning step after construction and can be normally used as a lithium ion secondary battery. In addition, the initial state of a lithium ion secondary battery may be a state of a lithium ion secondary battery at the time of shipment.

Here, regarding the battery capacity of a lithium ion secondary battery, an upper limit voltage and a lower limit voltage of the lithium ion secondary battery are set in advance based on an open-circuit voltage. The lithium ion secondary battery is charged to the upper limit voltage by CCCV charging and then is discharged to the lower limit voltage by CCCV discharging. At this time, when the lithium ion secondary battery in the initial state is discharged from the upper limit voltage to the lower limit voltage, the discharge capacity is set as the battery capacity of the lithium ion secondary battery in the initial state. CCCV is an abbreviation for constant current constant voltage.

In this embodiment, regarding a lithium ion secondary battery which is a target, a lower limit voltage is set as 3.0 V and an upper limit voltage is set as 4.1 V based on an open-circuit voltage. In this case, a state where the open-circuit voltage is 3.0 V refers to a SOC of 0%, and a state where the open-circuit voltage is 4.1 V refers to a SOC of 100%. The battery capacity corresponds to the discharge capacity which is measured after charging the lithium ion secondary battery by CCCV charging until the open-circuit voltage reaches 4.1 V, and then discharging the lithium ion secondary battery by CCCV discharging until the open-circuit voltage reaches 3.0 V. Here, "SOC" is an abbreviation for state of charge and represents a state of charge of a battery. Here, "SOC" can be determined based on a charging rate with respect to a state of full charge. Hereinafter, the charging rate with respect to a state of full charge will be referred to as "charging rate".

Hereinafter, deterioration of a lithium ion secondary battery will be described.

Figure 2:
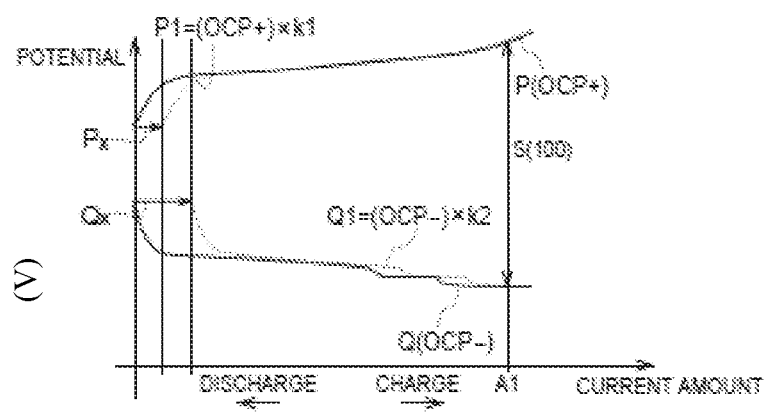
FIG. 2 is a graph showing an example of variations of a positive electrode potential and a negative electrode potential depending on a charge current amount of the lithium ion secondary battery 10.

FIG. 1 is a graph showing a typical example of a relationship between a charge current amount and an open-circuit voltage (OCV) of a lithium ion secondary battery. FIG. 2 is a graph showing an example of variations of a positive electrode potential and a negative electrode potential depending on a charge current amount of the lithium ion secondary battery. FIGS. 1 and 2 are schematically shown and do not strictly show the measurement results. In FIG. 1, a solid line S indicates a relationship between a SOC and an open-circuit voltage (OCV) of a lithium ion secondary battery in the initial state. A broken line S1 indicates a relationship between a SOC and an open-circuit voltage (OCV) of the lithium ion secondary battery after deterioration.

In FIG. 2, a solid line P indicates a relationship between a SOC and a positive electrode potential of the lithium ion secondary battery in the initial state. A broken line P1 indicates a relationship between a SOC and a positive electrode potential of the lithium ion secondary battery after deterioration. A solid line Q indicates a relationship between a SOC and a negative electrode potential of the lithium ion secondary battery in the initial state. A broken line Q1 indicates a relationship between a SOC and a negative electrode potential of the lithium ion secondary battery after deterioration. In FIG. 1, the horizontal axis represents the SOC of the lithium ion secondary battery, and the vertical axis represents the open-circuit voltage (OCV) of the lithium ion secondary battery. As indicated by the broken lines, the positive electrode and the negative electrode deteriorate (single-electrode capacity decreases) as they are used. As a result, the battery capacity of the lithium ion secondary batteries decreases.

In this specification, the positive electrode potential in the initial state will be appropriately referred to as "OCP+". The negative electrode potential in the initial state will be appropriately referred to as "OCP−". The positive electrode potential and the negative electrode potential can be defined as differences from a potential of a reference electrode, respectively. The reference electrode is formed of, for example, lithium metal. A typical relationship between a SOC and a positive electrode potential (OCP+) in the initial state is as indicated by the solid line P in FIG. 2. The solid line P will be appropriately referred to as "SOC-OCP+". A typical relationship between a SOC and a negative electrode potential (OCP−) in the initial state is as indicated by the solid line Q in FIG. 2. The solid line Q will be appropriately referred to as "SOC-OCP−".

In the initial state, the positive electrode potential varies along a graph P, and the negative electrode potential varies along a graph Q. Here, in an arbitrary state of charge (i) of the lithium ion secondary battery, a difference between a positive electrode potential P(i) and a negative electrode potential Q(i) is an open-circuit voltage S(i) of the lithium ion secondary battery 10 (S(i)=P(i)−Q(i)). After deterioration, in an arbitrary state of charge (j) of the lithium ion secondary battery, a difference between a positive electrode potential P1(j) and a negative electrode potential Q1(j), which follows the vertical axis of the graph, is an open-circuit voltage S1(j) of the lithium ion secondary battery 10 after deterioration (S1(j)=P1(j)−Q1(j)).

It is preferable that positions of the graphs P and Q indicating the values in the initial state and positions of the graphs P1 and Q1 indicating the values after deterioration are aligned with each other such that the open-circuit voltage S1(j) of the lithium ion secondary battery 10 after deterioration and the open-circuit voltage S(i) of the lithium ion secondary battery 10 in the initial state are positioned at the same voltage. For example, in FIG. 2, an open-circuit voltage of the lithium ion secondary battery 10 in the initial state at a SOC of 100% is set as reference A1.

That is, in FIG. 2, the open-circuit voltage S(100), which is the same as that at a SOC of 100% in the initial state, is set as reference A1. Positions of the graphs P and Q at which the open-circuit voltage S(100), which is the same as that at a SOC of 100% of the lithium ion secondary battery in the initial state, is shown and positions of the graphs P1 and Q1 of the lithium ion secondary battery after deterioration are aligned with each other on the horizontal axis. The SOC of the lithium ion secondary battery in the initial state at reference A1 is 100%. The SOC of the lithium ion secondary battery after deterioration at reference A1 is not necessarily 100%. At reference A1, the lithium ion secondary battery after deterioration shows the open-circuit voltage S(100) which is the same as that at a SOC of 100% in the initial state.

In FIG. 2, the horizontal axis represents the charge or discharge current amount. In FIG. 2, regarding the lithium ion secondary battery in the initial state, the positive electrode potential P(i) and the negative electrode potential Q(i) are drawn from reference A1 according to the charge or discharge current amount (i). Further, regarding the lithium ion secondary battery after deterioration, the positive electrode potential P1(j) and the negative electrode potential Q1(j) are drawn from reference A1 according to the charge or discharge current amount (j).

FIGS. 1 and 2 show a tendency of, for example, a lithium ion secondary battery including: particles of a lithium transition metal composite oxide having a layered structure (for example, lithium nickel cobalt manganese composite oxide) that are used as positive electrode active material particles; and graphite particles having a graphite structure that are used as a negative electrode active material.

As indicated by the solid lines P and Q in FIG. 2, in the lithium ion secondary battery in the initial state, the positive electrode potential P gradually decreases and the negative electrode potential Q gradually increases with respect to the discharge current amount. In the late stage of discharge, the positive electrode potential P rapidly decreases and the negative electrode potential Q rapidly increases. Further, the positive electrode potential P gradually increases and the negative electrode potential Q decreases stepwise with respect to the charge current amount.

On the other hand, as indicated by the broken lines P1 and Q1 in FIG. 2, in the lithium ion secondary battery after deterioration, a timing at which the positive electrode potential P1 decreases with respect to the discharge current amount and a timing at which the negative electrode potential Q1 increases with respect to the discharge current amount tend to be earlier than those in the initial state. A timing at which the positive electrode potential P1 increases with respect to the charge current amount is earlier than that in the initial state, and a timing at which the negative electrode potential Q1 decreases stepwise with respect to the charge current amount is later than that in the initial state.

The above-described tendency of the positive electrode after deterioration is presumed to be that the capacity of the positive electrode active material capable of storing or releasing lithium ions is reduced. That is, as shown in FIG. 1, during the charging or discharging of the lithium ion secondary battery in a predetermined open-circuit voltage range, the capacity of the positive electrode active material capable of storing or releasing lithium ions is reduced. This phenomenon is called "deterioration of the positive electrode". As indicated by Px in the graph of FIG. 2, the width in which the positive electrode works along the horizontal axis representing the charge current amount is reduced and thus may also be called "positive electrode shrinkage".

The above-described tendency of the negative electrode after deterioration is presumed to be that the capacity of the negative electrode active material capable of storing or releasing lithium ions is reduced. That is, during the charging or discharging of the lithium ion secondary battery in a predetermined open-circuit voltage range, the capacity of the negative electrode active material capable of storing or releasing lithium ions is reduced. This phenomenon is called "deterioration of the negative electrode". As indicated by Qx in the graph of FIG. 2, the width in which the negative electrode works along the horizontal axis representing the charge current amount is reduced and thus may also be called "negative electrode shrinkage".

In the lithium ion secondary battery, during charging, lithium ions are released from the positive electrode and then are stored in the negative electrode, and charges accumulate on the negative electrode. During discharging, the lithium ions accumulating on the negative electrode are released from the negative electrode and return to the positive electrode. During the charging or discharging, the lithium ions are incorporated into a film or are partially deposited. Therefore, along with the progress of deterioration, the amount of lithium contributing to a cell reaction is reduced. Here, the amount of lithium contributing to a cell reaction, which is reduced due to the incorporation into a film or the partial deposition, is called "amount of lithium trapped".

In the graph shown in FIG. 1, when the discharge side is observed, as compared to the graphs P and Q in the initial state, a timing at which the positive electrode potential decreases and a timing at which the negative electrode potential increases are shifted as shown in the graphs P1 and Q1 after deterioration. The reason why the timing at which the positive electrode potential decreases and the timing at which the negative electrode potential increases are shifted is presumed to be that the amount of lithium contributing to a cell reaction decreases (the amount of lithium trapped increases). The present inventors thought that the deterioration of the lithium ion secondary battery relates to the deterioration of the positive electrode, the deterioration of the negative electrode, and a decrease in the amount of lithium contributing to a cell reaction.

According to the control method for a lithium ion secondary battery disclosed herein, a deterioration degree of a lithium ion secondary battery is obtained based on a deterioration degree K1 of a positive electrode, a deterioration degree K2 of a negative electrode, and an amount of lithium trapped TLi. According to the control method for a lithium ion secondary battery disclosed herein, a deterioration degree K1 of a positive electrode, a deterioration degree K2 of a negative electrode, and an amount of lithium trapped TLi are estimated, respectively, based on records of a temperature environment and a SOC regarding a lithium ion secondary battery which is a target. According to the control method for a lithium ion secondary battery disclosed herein, a deterioration degree of a lithium ion secondary battery can be more accurately estimated, and the lithium ion secondary battery can be more appropriately controlled.

Figure 3:
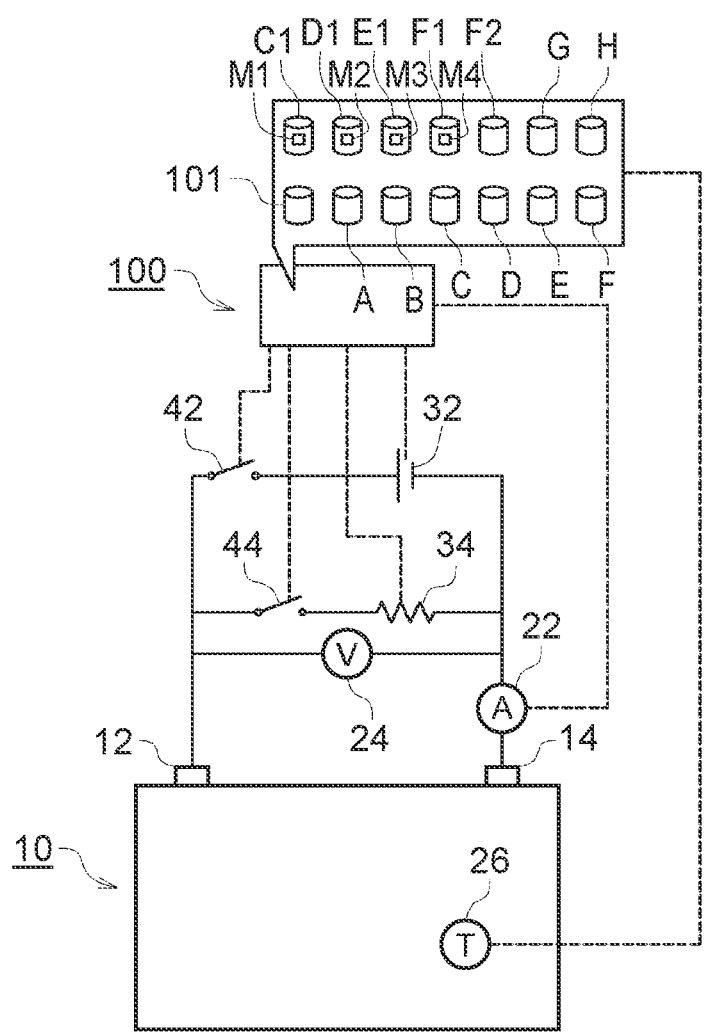
FIG. 3 is a block diagram schematically showing a control device 100.

FIG. 3 is a block diagram schematically showing a control device 100. The control device 100 embodies the control method for a lithium ion secondary battery disclosed herein. The control device 100 includes: an arithmetic unit that performs an arithmetic operation according to a predetermined program; and a storage device that stores electronic information. Here, the arithmetic unit may be called, for example, a central processing unit (CPU). The storage device may be called, for example, a memory or a hard disc. The control device 100 performs a predetermined arithmetic operation according to a predetermined program and electrically controls the lithium ion secondary battery 10 based on the result of the arithmetic operation. For use in a vehicle, in order to control an engine, a steering wheel, a brake, a secondary battery, or the like, it is preferable that the control device 100 is incorporated into an electronic control unit (ECU) mounted on a vehicle.

In an example shown in FIG. 3, an input device 32 (for example, a power supply 32) and an output device 34 (for example, an external device 34 of an output destination) are connected in parallel to a positive electrode terminal 12 and a negative electrode terminal 14 of the lithium ion secondary battery 10, which is a control target, respectively. An ammeter 22 is connected in series to the lithium ion secondary battery 10, and a voltmeter 24 is connected in parallel to the lithium ion secondary battery 10. A temperature sensor 26 is attached to the lithium ion secondary battery 10.

Information relating to measured values output from the ammeter 22, the voltmeter 24, and the temperature sensor 26 is input to the control device 100. The control device 100 estimates a deterioration degree of the lithium ion secondary battery 10 and controls the charging and discharging of the lithium ion secondary battery 10. In the example shown in FIG. 3, the control device 100 controls the input device 32, the output device 34, an input switch 42, and an output switch 44. The control device 100 can adjust a current value applied to the lithium ion secondary battery 10, for example, by controlling the input device 32 or the output device 34. The application of a current value to the lithium ion secondary battery 10 can be stopped, for example, by controlling the input switch 42 or the output switch 44.

Here, the temperature sensor 26 detects a temperature of the lithium ion secondary battery 10, which is a target, and is attached to a predetermined position, for example, a side surface of the lithium ion secondary battery 10. The structure of the temperature sensor 26 is not particularly limited as long as it has necessary sensitivity, can input an electrical signal corresponding to a temperature to the control device 100, and can exhibit the above-described function.

As shown in FIG. 3, the control device 100 includes the SOC detecting unit 101, recording units A, B, and calculating units C to F.

In the control device 100, the SOC detecting unit 101 detects a SOC of the lithium ion secondary battery 10 which is a target. As a method of detecting a SOC of the lithium ion secondary battery 10 in the control device 100, specifically, various methods may be adopted. Hereinafter, an example of the method will be described. The method of detecting a SOC is not limited to the following exemplary method.

The method of detecting a SOC of the lithium ion secondary battery 10 will be described. In this embodiment, using the same type of lithium ion secondary battery, data corresponding to a relationship between an open-circuit voltages (OCV) in the initial state and a SOC is obtained through an experiment and is stored in advance in the control device 100. Data corresponding to a variation (the graph P in FIG. 2) of a positive electrode potential (OCP+) depending on a charge current amount of the lithium ion secondary battery 10 in the initial state is obtained through an experiment and is stored in advance in the control device 100. Data corresponding to a variation (the graph Q in FIG. 2) of a negative electrode potential (OCP−) depending on a charge current amount of the lithium ion secondary battery 10 in the initial state is obtained through an experiment and is stored in advance in the control device 100.

The SOC detecting unit 101 detects a SOC of the lithium ion secondary battery 10 in the initial state based on the relationship between an open-circuit voltage (OCV) and a SOC, which has been stored in the control device 100 in advance, and an open-circuit voltage (OCV). The detected SOC is stored in the control device 100 as a charging rate SOCy immediately before an integration period. Next, a variation in charging rate (ΔSOC) is calculated based on an integrated current amount (ΔI) which is obtained by integrating a charge current amount and a discharge current amount based on charge current values and discharge current values in a predetermined integration period.

Here, the integrated current amount (ΔI) is positive in a case where the charge current amount is more than the discharge current amount, and is negative in a case where the discharge current amount is more than the charge current amount. As expressed in the following Expression (B), the variation in charging rate (ΔSOC) can be obtained by dividing the integrated current amount (ΔI) by a battery capacity (Io).

$$\Delta SOC = \Delta I / Io \quad (B)$$

As the lithium ion secondary battery 10 which is a target is used, the battery capacity (Io) tends to decrease. That is, as the lithium ion secondary battery 10 is used, the battery capacity tends to gradually decrease from that in the initial state. In order to calculate the variation in charging rate ΔSOC, the integrated current amount (ΔI) is divided by the battery capacity (Io). At this time, in a strict sense, the battery capacity (Io) refers to a battery capacity immediately before the integration period. By using a battery capacity Ix after deterioration which is calculated in the previous integration period, the variation in charging rate ΔSOC may be calculated from Expression (B1). In this case, as needed, the battery capacity (Io) stored in the control device 100 may be updated to the battery capacity Ix after deterioration which is calculated in the previous integration period. A method of calculating the battery capacity Ix after deterioration will be described below in more detail.

$$\Delta SOC = \Delta I/Ix \quad (B1)$$

As shown in the following Expression (C), a charging rate SOCx after the integration period is calculated as the sum of the charging rate SOCy immediately before the integration period and the variation in charging rate ΔSOC.

$$SOCx = SOCy + \Delta SOC \quad (C)$$

As needed, the charging rate SOCy immediately before the integration period, which is stored in the control device 100, may be updated to the charging rate SOCx which is calculated after the integration period.

In Expression (C), SOCy refers to a charging rate immediately before the integration period of the integrated current amount which is calculated during the calculation of the variation in charging rate ΔSOC. Here, the integrated current amount (ΔI) and the charging rate SOCx after the integration period are calculated per integration period which is a predetermined unit time. The integration period can be arbitrarily set. The integration period may be set to, for example, 15 seconds, 30 seconds, 1 minute, 5 minutes, or 10 minutes. In this embodiment, the integration period is set to 1 minute. The battery capacity after deterioration and the charging rate SOCx after the integration period are calculated per 1 minute. There are various other methods of detecting the charging rate SOCx after the integration period. For example, an appropriate method may be adopted in consideration of characteristics of an active material.

In the control device 100, the recording unit A records a temperature history based on the temperature detected by the temperature sensor 26. For example, information relating to the temperature detected by the temperature sensor 26 may be recorded in chronological order.

In the control device 100, the second recording unit B records a SOC history based on the SOC detected by the SOC detecting unit 101. For example, information relating to the SOC detected by the SOC detecting unit 101 may be recorded in chronological order.

In the control device 100, the calculating unit C calculates a deterioration degree K1 of a positive electrode of the lithium ion secondary battery 10, which is a target, based on the temperature history and the SOC history. In the control device 100, the calculating unit D calculates a deterioration degree K2 of a negative electrode of the lithium ion secondary battery 10, which is a target, based on the temperature history and the SOC history. In the control device 100, the calculating unit E calculates an amount of lithium trapped TLi in the lithium ion secondary battery 10 based on the temperature history and the SOC history.

FIGS. 4A and 4B show an example of data tables M1 to M3 which are used to calculate the deterioration degree K1 of the positive electrode, the deterioration degree K2 of the negative electrode, and the amount of lithium trapped TLi.

As shown in FIGS. 4A and 4B, the data tables M1 to M3 which are used to calculate the deterioration degree K1 of the positive electrode, the deterioration degree K2 of the negative electrode, and the amount of lithium trapped TLi are prepared for a state (stand-still state) where the lithium ion secondary battery is left to stand and a state (current application state) where a current value is applied to the lithium ion secondary battery, respectively. The data tables M1 to M3 shown in FIGS. 4A and 4B are created for convenience of description in order to make the control method disclosed herein easily understood. The data tables M1 to M3 shown in FIGS. 4A and 4B do not necessarily show actual specific data of the lithium ion secondary battery. For example, in FIGS. 4A and 4B, data is input in regard to SOCs in a range of 0% to 100% at intervals of 20% and four temperatures −30° C., 0° C., 25° C., and 60° C. In practice, data tables in which SOCs and temperatures are more finely divided may be used.

The data tables may be created in advance, for example, through an experiment of estimating to what degree the same type of lithium ion secondary battery as the lithium ion secondary battery, which is a target, deteriorates when leaving to stand at the temperature and in the SOC.

In the stand-still state shown in FIG. 4A, for example, the lithium ion secondary battery is left to stand at a specific temperature in a specific SOC for a number of days (for example, about 10 days) for which the deterioration thereof can be sufficiently observed. In data tables M1A to M3A regarding the stand-still state, the deterioration degree K1 of the positive electrode, the deterioration degree K2 of the negative electrode, and the amount of lithium trapped TLi are evaluated which are obtained after the lithium ion secondary battery is left to stand at a specific temperature in a specific SOC for one day based on the test.

In addition, in the current application state shown in FIG. 4B, for example, a control operation of repeating charging and discharging within a short period of time at a specific temperature such that the lithium ion secondary battery is at a specific SOC on average, is performed for a predetermined of time (for example, about 24 hours) for which the deterioration can be sufficiently observed. In data tables M1B to M3B regarding the current application state, the deterioration degree K1 of the positive electrode, the deterioration degree K2 of the negative electrode, and the amount of lithium trapped TLi are evaluated which are obtained after a current value is applied to the lithium ion secondary battery at a specific temperature in a specific SOC for one day based on the test.

Here, regarding the deterioration degree K1 of the positive electrode and the deterioration degree K2 of the negative electrode, to what degree the positive electrode and the negative electrode deteriorate (positive electrode shrinkage and negative electrode shrinkage) are evaluated when values in the initial state are set as 1. Regarding the amount of lithium trapped TLi, a numerical value corresponding to the capacity (Ah) is evaluated according to the amount of lithium trapped when a value in the initial state is set as 0.

In the data tables M1A, M2A of FIG. 4A, the deterioration degree (K1/day) of the positive electrode obtained after being left to stand for one day, and the deterioration degree (K2/day) of the negative electrode obtained after being left to stand for one day are recorded. In the example of FIG. 4A, the deterioration degree K1 of the positive electrode and the deterioration degree K2 of the negative electrode are evaluated in terms of coefficients when values in the initial state are set as 1. A value close to 1 implies that the deterioration is small. In the example of FIG. 4A, in a case of being left to stand at a low temperature of −30° C., the deterioration degree K1 of the positive electrode and the deterioration degree K2 of the negative electrode are 1, respectively, which imply small deterioration. On the other hand, as the temperature increases, the deterioration increases. In particular, the positive electrode is more likely to be effected by the temperature than the negative electrode.

The data tables M1B and M2B of FIG. 4B contain the deterioration degree K1 of the positive electrode and the deterioration degree K2 of the negative electrode, respectively, obtained after the application of a current value for one day. In the example of FIG. 4B, the deterioration degree K1 of the positive electrode and the deterioration degree K2 of the negative electrode are evaluated in terms of coefficients when values in the initial state are set as 1. A value close to 1 implies that the deterioration is small. The example of FIG. 4B shows that, in a state where the SOC is close to 0% or 100%, the deteriorations of the positive electrode and the negative electrode are large, respectively. The example of FIG. 4B also shows that, as the temperature increases, the deteriorations of the positive electrode and the negative electrode are large, respectively.

The data table M3A of FIG. 4A contains the amount of lithium trapped TLi obtained after leaving the lithium ion secondary battery to stand for one day. In the example of FIG. 4A, the amount of lithium trapped TLi are evaluated in terms of numerical values range from 0 to 1, and 0 implies that the amount of lithium trapped TLi does not substantially increase. A value close to 0 implies that the amount of lithium trapped TLi is small. A negative value of the amount of lithium trapped TLi implies that trapped lithium is recovered. In other words, lithium which does not contribute to a cell reaction of the lithium ion secondary battery is recovered to a state of contributing to the cell reaction. A negative value represents the amount of lithium recovered.

The data table M3A of FIG. 4A shows that, in a case where the lithium ion secondary battery is left to stand, the amount of lithium trapped TLi depends on the temperature. Here, in a case where the lithium ion secondary battery is left to stand at a low temperature of −30° C., the amount of lithium trapped TLi is 0, which implies that the amount of lithium trapped TLi does not substantially change. At a temperature of 0° C. to 25° C., the amount of lithium trapped TLi is negative and decreases, and thus the amount of lithium contributing to a cell reaction increases. When the temperature increases to about 60° C., the amount of lithium trapped TLi is positive and increases.

The data table M3B of FIG. 4B contains the amount of lithium trapped TLi obtained after applying a current value to the lithium ion secondary battery for one day. The data table M3B of FIG. 4B shows that, as the temperature increases from a low temperature of −30° C. at the same SOC, the amount of lithium trapped TLi increases, and there is a large effect on the amount of lithium trapped TLi. In a SOC of 40% to 60%, the amount of lithium trapped TLi is small. As the SOC becomes close to 0% or 100%, the amount of lithium trapped TLi increases.

For example, when the deterioration degree K1 of the positive electrode, the deterioration degree K2 of the negative electrode, and the amount of lithium trapped TLi varies depending on a current application rate, it is preferable that plural data tables corresponding to levels of the current application rate may be prepared. For example, although not shown in the drawing, plural data tables corresponding to levels of a current rate may be prepared as the data tables M1B, M2B, and M3B regarding the current application state. Alternatively, during the current application, a correction coefficient for correcting a data table according to a current rate may be prepared. By preparing a data table corresponding to a current rate or correcting a data table according to current rate, the deterioration degree K1 of the positive electrode, the deterioration degree K2 of the negative electrode, and the amount of lithium trapped TLi can be accurately calculated.

Hereinafter, calculation examples of the deterioration degree K1 of the positive electrode, the deterioration degree K2 of the negative electrode, and the amount of lithium trapped TLi will be sequentially described.

In order to calculate the deterioration degree K1 of the positive electrode, the control device 100 refers to the data tables M1A, M1B relating to the deterioration degree K1 of the positive electrode per unit time based on a temperature history of the lithium ion secondary battery 10 recorded in the recording unit A and a SOC history of the lithium ion secondary battery 10 recorded in the recording unit B. Here, when the lithium ion secondary battery 10 is left to stand for the unit time, the control device 100 refers to the data table M1A. When a current value is applied to the lithium ion secondary battery 10 for the unit time, the control device 100 refers to the data table M1B. As a result, a deterioration degree K1($t$) of the positive electrode per unit time can be appropriately evaluated. Here, the deterioration degree K1($t$) of the positive electrode refers to a reference value at a given unit time ($t$). The deterioration degree K1 of the positive electrode is obtained by integrating the deterioration degrees K1($t$) of the positive electrode per unit time obtained in a use period of the lithium ion secondary battery 10.

In order to calculate the deterioration degree K2 of the negative electrode, the control device 100 refers to the data tables M2A, M2B relating to the deterioration degree K2 of the negative electrode per unit time based on a temperature history of the lithium ion secondary battery 10 recorded in the recording unit A and a SOC history of the lithium ion secondary battery 10 recorded in the recording unit B. Here, when the lithium ion secondary battery 10 is left to stand for the unit time, the control device 100 refers to the data table M2A. When a current value is applied to the lithium ion secondary battery 10 for the unit time, the control device 100 refers to the data table M2B. As a result, a deterioration degree K2($t$) of the negative electrode per unit time can be appropriately evaluated. Here, the deterioration degree K2($t$) of the negative electrode refers to a reference value at a given unit time ($t$). The deterioration degree K2 of the negative electrode is obtained by integrating the obtained deterioration degrees K2($t$) of the negative electrode per unit time obtained in a use period of the lithium ion secondary battery 10.

In this embodiment, as described above, the data tables contain the deterioration degree K1 of the positive electrode and the deterioration degree K2 of the negative electrode per day. Here, the reference value of the deterioration degree K1 of the positive electrode and the reference value of the deterioration degree K2 of the negative electrode are evaluated in terms of coefficients when the values in the initial state are set as 1. In the temperature history of the recording unit A and the SOC history of the recording unit B, a temperature and a SOC are recorded per minute. In this case, the calculation expressions are as shown in the following Expressions (D) and (E).

$$K1 = \Pi(1 - \{(1 - K1(t))/1440\}) \quad (D)$$

$$K2 = \Pi(1 - \{(1 - K2(t))/1440\}) \quad (E)$$

Here, the reference value of the deterioration degree K1 of the positive electrode and the reference value of the deterioration degree K2 of the negative electrode are evaluated in terms of coefficients when the values in the initial state are set as 1. Therefore, "(1−K1($t$))" implies to what degree the deterioration progresses for the unit time (here, one day) in the data tables. Regarding (1−K1($t$))/1440, "(1−K1($t$))" is divided by 1440 minutes (60 minutes*24) to be evaluated as the deterioration degree per minute because the reference values of the data tables are used to evaluate the deterioration degrees per day, whereas the temperature history of the recording unit A and the SOC history of the recording unit B are recorded per minute. (1−{(1−K1($t$))/1440}) implies the deterioration degree for the unit time (here, 1 minute). Π is a symbol which implies that values of $(1-\{(1-K1(t))/1440\})$ are integrated. Here, Π refers to an infinite product.

That is, in a predetermined time (x) from 0, a value of $(1-\{(1-K1(t))\}$ (t=0 to x) is calculated per unit time (one minute). The values of 0 to x are sequentially multiplied. As a result, the deterioration degree K1 of the positive electrode in the period (t=0 to x) is obtained. Here, the deterioration degree K1 of the positive electrode has been described, but the deterioration degree K2 of the negative electrode can also be calculated using the above-described method. As the method of integrating the deterioration degrees per unit time, an appropriate integration method may be adopted according to a method of setting the deterioration degree and characteristics of an active material of the lithium ion secondary battery. For example, here, Π implies an infinite product but may imply the sum total depending on a method of setting the deterioration degree.

Using the above-described calculation expressions, the deterioration degree K1 of the positive electrode and the deterioration degree K2 of the negative electrode for a give period can be estimated. The control device 100 may store an initial deterioration degree of the period (previously calculated deterioration degree). The initial deterioration degree in the period may be multiplied by the calculated deterioration degree in the period. Here, the initial deterioration degree of the positive electrode in the period (previously calculated deterioration degree) is set as LK1. The initial deterioration degree of the negative electrode in the period (previously calculated deterioration degree) is set as LK2. In this case, the deterioration degree K1 of the positive electrode and the deterioration degree K2 of the negative electrode can be calculated by Expressions (D1) and (E1), respectively.

$$K1 = LK1 \times \Pi(1-\{(1-K1(t))/1440\}) \quad (D1)$$

$$K2 = LK2 \times \Pi(1-\{(1-K2(t))/1440\}) \quad (E1)$$

For example, by continuously calculating the deterioration degrees in a period from the initial state to a certain time, the deterioration degree K1 of the positive electrode and the deterioration degree K2 of the negative electrode in the period can be calculated.

The calculating unit C calculates the deterioration degree K1 of the positive electrode of the lithium ion secondary battery 10, which is a target, based on the temperature history and the SOC history. In this case, the control device 100 may include a storing unit C1 storing the data tables M1A, M1B that contain in advance a relationship between a temperature, a SOC, and a deterioration degree of a positive electrode per unit time. The calculating unit C may calculate the deterioration degree K1 of the positive electrode based on the data tables M1A, M1B, which are stored in the storing unit C1, and a positive electrode deterioration amount per unit time which is obtained based on the temperature history and the SOC history.

The calculating unit D calculates the deterioration degree K2 of the negative electrode of the lithium ion secondary battery, which is a target, based on the temperature history and the SOC history. In this case, the control device 100 may include a storing unit D1 storing the data tables M2A, M2B that contain in advance a relationship between a temperature, a SOC, and a deterioration degree of a negative electrode per unit time. The calculating unit D may calculate the deterioration degree K2 of the negative electrode based on the data tables M2A, M2B, which are stored in the storing unit D1, and a negative electrode deterioration amount per unit time which is obtained based on the temperature history and the SOC history.

Next, the amount of lithium trapped TLi is calculated from the following Expression (F).

$$TLi = \Sigma(TLi(t)/1440) \quad (F)$$

That is, in this embodiment, as described above, the amount of lithium trapped TLi is recorded per day in the data tables M3A, M3B. Here, a reference value of the amount of lithium trapped TLi evaluated in terms of a value in a range of 0 to 1 when a value in the initial state is set as 0 and a value in a maximum deterioration state is set as 1. In the temperature history of the recording unit A and the SOC history of the recording unit B, a temperature and a SOC are recorded per minute. Here, TLi(t) refers to a reference value of the amount of lithium trapped TLi at a give unit time (t). Σ implies the sum of products. For example, in a case where the amount of lithium trapped TLi in a period of 0 to x is calculated, values of (TLi(t)/1440) of t=0 to x are added up.

The control device 100 may store an initial amount of lithium trapped LTLi in the period. In this case, by adding up the initial amount of lithium trapped LTLi in the period and the amount of lithium trapped calculated in the period, the amount of lithium trapped TLi to which the initial amount of lithium trapped LTLi in the period can be calculated. In this case, for example, by continuously calculating the amount of lithium trapped TLi in a period from the initial state to a certain time using the following Expression (F1), the amount of lithium trapped TLi in the period can be calculated.

$$TLi = LTLi + \Sigma(TLi(t)/1440) \quad (F1)$$

The calculating unit E calculates the amount of lithium trapped TLi in the lithium ion secondary battery, which is a target, based on the temperature history and the SOC history. In this case, the control device 100 may include a storing unit E1 storing the data tables M3A, M3B that contain in advance a relationship between a temperature, a SOC, and an amount of lithium trapped per unit time. The calculating unit E may calculate the amount of lithium trapped TLi based on the data tables M3A, M3B, which are stored in the storing unit E1, and an amount of lithium trapped ΔTLi per unit time which is obtained based on the temperature history and the SOC history.

A calculating unit F calculates a deterioration degree X of the lithium ion secondary battery 10 based on the deterioration degree K1 of the positive electrode, the deterioration degree K2 of the negative electrode, and the amount of lithium trapped TLi. Here, in the control device 100, three-dimensional map data, with which the deterioration degree X of the lithium ion secondary battery 10 can be obtained based on the deterioration degree K1 of the positive electrode, the deterioration degree K2 of the negative electrode, and the amount of lithium trapped TLi, may be prepared in advance. The three-dimensional map data may be expressed by X=(K1, K2, TLi). An operation of calculating the deterioration degree X of the lithium ion secondary battery 10 can be obtained from the three-dimensional map data (X=(K1, K2, TLi)) based on the deterioration degree K1 of the positive electrode, the deterioration degree K2 of the negative electrode, and the amount of lithium trapped TLi.

In another method of the calculating unit F, the positive electrode potential OCP+ after deterioration (the graph P1 in FIG. 2) is obtained based on the deterioration degree K1 of the positive electrode, and the negative electrode potential OCP− (the graph Q1 in FIG. 2) after deterioration is obtained based on the deterioration degree K2 of the negative electrode. A shift amount between the positive electrode potential OCP+ after deterioration and the negative electrode potential OCP− after deterioration is obtained based on the amount of lithium trapped TLi. A position at which OCV ((OCP+)−(OCP−)) reaches a predetermined lower limit voltage (in this embodiment, 3.0 V) and a position at which OCV ((OCP+)−(OCP−)) reaches a predetermined upper limit voltage (in this embodiment, 4.1 V) are specified. The battery capacity is calculated in a range of 3.0 V to 4.1 V. The calculated battery capacity is set as the battery capacity Ix after deterioration. Based on the following Expression (G), the deterioration degree X (capacity retention) of the lithium ion secondary battery 10 may be calculated by dividing the battery capacity Ix after deterioration by an initial capacity Io.

$$X=Ix/Io \tag{G}$$

In this way, in the control device 100, operations of the calculating unit F may include an operation F1 of calculating an estimated shift amount between a positive electrode potential and a negative electrode potential based on the amount of lithium trapped TLi.

The operations of the calculating unit F may also include an operation F2 of estimating the battery capacity Ix of the lithium ion secondary battery 10 after deterioration based on the deterioration degree K1 of the positive electrode, the deterioration degree K2 of the negative electrode, and the amount of lithium trapped TLi. Even in this case, the calculating unit F calculates the deterioration degree X of the lithium ion secondary battery 10 from (Battery Capacity Ix after Deterioration)/(Initial Capacity Io) as in Expression (G) described above.

The control device 100 may suppress a current value applied to the lithium ion secondary battery 10 in a case where the deterioration degree K1 of the positive electrode exceeds a predetermined threshold or in a case where the deterioration degree K2 of the negative electrode exceeds a predetermined threshold. In a case where the deterioration degree K1 of the positive electrode exceeds a predetermined threshold or in a case where the deterioration degree K2 of the negative electrode exceeds a predetermined threshold, a positive electrode active material or a negative electrode active material may deteriorate. By suppressing a current value applied to the lithium ion secondary battery 10, the capacity deterioration of the lithium ion secondary battery 10 can be suppressed.

<Current Suppressing Unit G>

In this case, the control device 100 may include a current suppressing unit G which performs the above-described operation. The current suppressing unit G suppresses a current value applied to the lithium ion secondary battery 10 in a case where the deterioration degree K1 of the positive electrode exceeds a predetermined threshold or in a case where the deterioration degree K2 of the negative electrode exceeds a predetermined threshold. Here, thresholds corresponding to circumstances in which the application of a current value to the lithium ion secondary battery 10 should be suppressed can be arbitrarily set for each of the deterioration degree K1 of the positive electrode and the deterioration degree K2 of the negative electrode.

For example, the control device 100 may include a storing unit F1 and a calculating unit F2. Here, the storing unit F1 may include a data table M4 (J=(K1, K2)) that contains in advance a relationship between the deterioration degree K1 of the positive electrode, the deterioration degree K2 of the negative electrode, and a coefficient J for suppressing a current value applied to the lithium ion secondary battery 10. The calculating unit F2 calculates a current value applied to the lithium ion secondary battery based on the deterioration degree K1 of the positive electrode and the deterioration degree K2 of the negative electrode. Here, in an operation of the calculating unit F2, the coefficient J for suppressing a current value applied to the lithium ion secondary battery 10 is obtained based on the deterioration degree K1 of the positive electrode, the deterioration degree K2 of the negative electrode, and the data table M4 (J=(K1, K2)). As in Expression (H), in a normal control mode, an actually applied current value Ax is obtained by multiplying a current value Ao, which should be applied to the lithium ion secondary battery 10, by the coefficient J.

$$Ax=Ao \times J \tag{H}$$

Here, the coefficient J refers to a coefficient for suppressing a current value applied to the lithium ion secondary battery 10 and may be set to a numerical value in a range of 0 to 1.

In a case where the amount of lithium trapped TLi exceeds a predetermined threshold, the application of a current value to the lithium ion secondary battery may be stopped based on the amount of lithium trapped TLi. In a case where the amount of lithium trapped TLi exceeds a predetermined threshold, the amount of lithium not contributing to a cell reaction increases to exceed a predetermined value in the lithium ion secondary battery 10. In this case, by stopping the application of a current value to the lithium ion secondary battery 10, the amount of lithium contributing to a cell reaction is recovered, and the amount of lithium trapped TLi can be reduced.

In this case, the control device 100 may include a stop control unit H. The stop control unit H stops the application of a current value to the lithium ion secondary battery 10 based on the amount of lithium trapped TLi in a case where the amount of lithium trapped TLi exceeds a predetermined threshold. Here, a threshold corresponding to a circumstance in which the application of a current value to the lithium ion secondary battery 10 should be suppressed can be arbitrarily set for the amount of lithium trapped TLi.

As described above, the control device 100, which performs the deterioration degree calculating method for the lithium ion secondary battery 10, may include processing units which execute operations, such as the above-described operations F1, F2, of calculating the deterioration degree of the lithium ion secondary battery based on the deterioration degree K1 of the positive electrode, the deterioration degree K2 of the negative electrode, or the amount of lithium trapped TLi.

Figure 5:
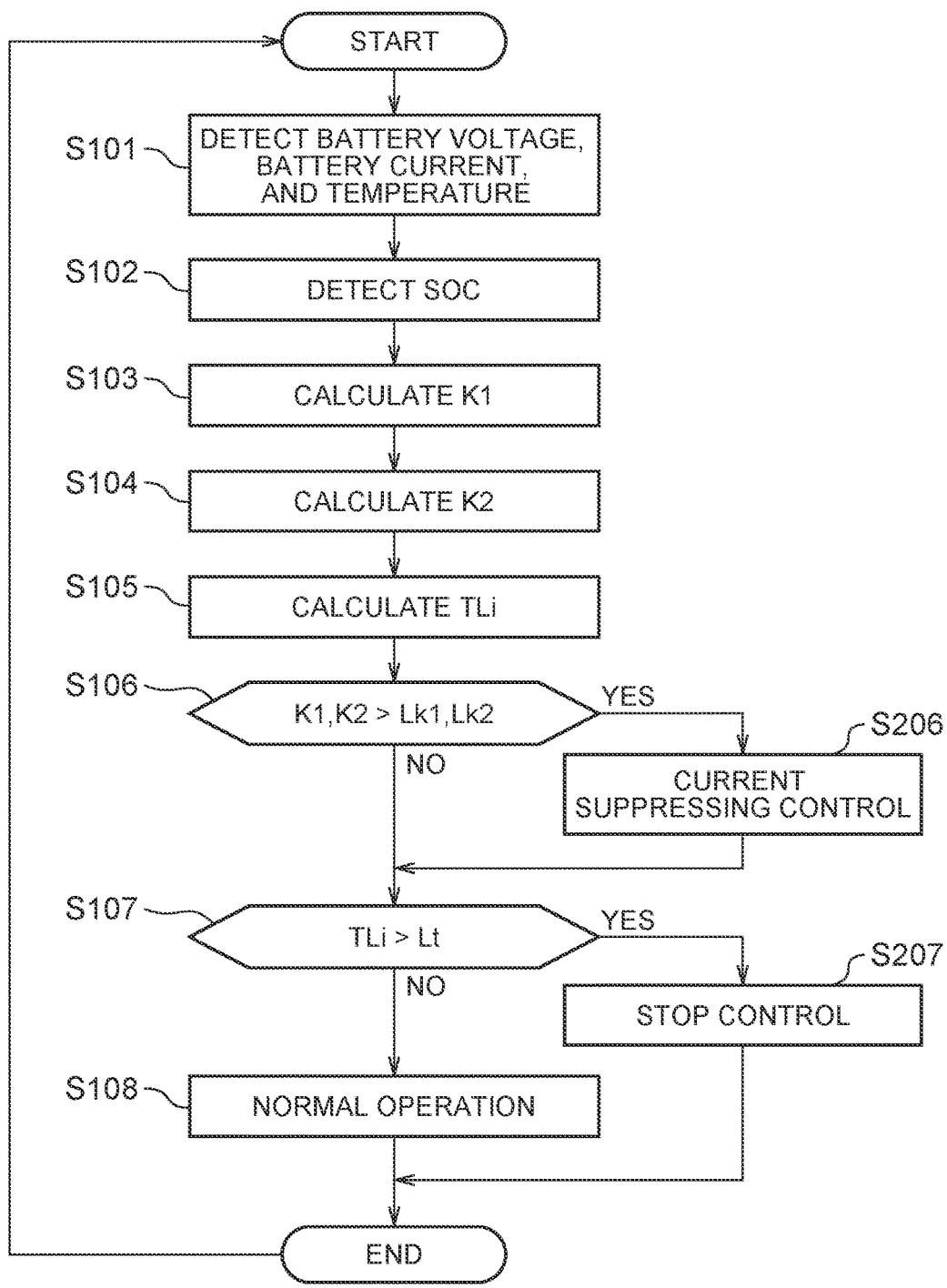
FIG. 5 is an example of a control flow of the control device 100.

FIG. 5 is an example of a control flow of the control device 100. The control flow shown in FIG. 5 is as follows.

S101: A voltage, a current, and a temperature of a lithium ion secondary battery, which is a control target, is detected. In the control device 100, the recording unit A records a temperature history based on the temperature detected by the temperature sensor. A voltage value history and a current value history are recorded in the control device 100 together (refer to FIG. 3).

S102: A SOC of the lithium ion secondary battery, which is a control target, is detected. In the control device 100, the recording unit B records a SOC history based on the SOC detected by the SOC detecting unit 101 (refer to FIG. 3).

S103: The deterioration degree K1 of the positive electrode is calculated. In the control device 100, the calculating unit C calculates the deterioration degree K1 of the positive electrode of the lithium ion secondary battery 10, which is a target, based on the temperature history and the SOC history (refer to FIG. 3).

S104: The deterioration degree K2 of the negative electrode is calculated. In the control device 100, the calculating unit D calculates the deterioration degree K2 of the negative electrode of the lithium ion secondary battery 10, which is a target, based on the temperature history and the SOC history (refer to FIG. 3).

S105: The amount of lithium trapped TLi is calculated. In the control device 100, the calculating unit E calculates the amount of lithium trapped TLi in the lithium ion secondary battery 10, which is a target, based on the temperature history and the SOC history (refer to FIG. 3).

S106: The capacity deterioration of the lithium ion secondary battery, which is a target, is determined based on the deterioration degree K1 of the positive electrode and the deterioration degree K2 of the negative electrode. In the flow shown in FIG. 5, the control device 100 determines whether or not the deterioration degree K1 of the positive electrode exceeds a predetermined threshold Lk1 (K1>Lk1) (refer to FIG. 3). Further, whether or not the deterioration degree K2 of the negative electrode exceeds a predetermined threshold Lk2 (K2>Lk2) is determined.

S206: In a case where the deterioration degree K1 of the positive electrode exceeds the threshold (Lk1) or in a case where the deterioration degree K2 of the negative electrode exceeds the threshold (Lk2), the current suppressing control operation (S206) is performed. In the control device 100, the current suppressing unit G suppresses the application of a current value to the lithium ion secondary battery 10 which is a target. For example, the control device 100 may control the lithium ion secondary battery 10, which is a target, according to a current value Ig which is calculated by storing a relational expression or a data table expressed by Ig=f(k1, k2) in advance.

S107: Whether or not the amount of lithium trapped TLi exceeds a predetermined threshold (Lt) (TLi>Lt) is determined.

S207: The stop control operation is performed. In a case where the amount of lithium trapped TLi exceeds the predetermined threshold (Lt), the application of the lithium ion secondary battery 10, which is a target, is stopped. The control device 100 is performed by the stop control unit H. For example, the control device 100 may be configured to set a time of stopping the application of a current value to the lithium ion secondary battery 10, which is a target, according to a time Th which is calculated by storing a relational expression or a data table expressed by Th=f(TLi) in advance.

S108: The normal current application operation is performed. In a case where the deterioration degree K1 and the deterioration degree K2 do not exceed the thresholds (Lk1, Lk2) in the determination step S106, and in a case where the amount of lithium trapped TLi does not exceed the predetermined threshold (Lt) in the determination step S107, the control device 100 performs the normal current application operation of applying a current value to the lithium ion secondary battery 10 which is a target.

In a state where the lithium ion secondary battery 10, which is a target, is used, it is preferable that this control operation is performed at all times. After completion of the control operation, the process returns to the start operation. In a state where the lithium ion secondary battery 10, which is a target, is used, the control operation is repeatedly performed. Although not shown in the drawing, for the operation of returning to the start operation after completion of the control operation, a configuration of ending the control operation under a specific condition may be adopted by providing a determining unit in which the condition for ending the control operation is set.

Hereinabove, the deterioration degree calculating method, the control method, and the control device for a lithium ion secondary battery disclosed herein have been described in various ways. The deterioration degree calculating method, the control method, and the control device for a lithium ion secondary battery disclosed herein are not limited to the above-described embodiment, and various modifications can be made.

The deterioration degree calculating method, the control method, and the control device for a lithium ion secondary battery disclosed herein can be used to control various lithium ion secondary batteries. Examples of a positive electrode active material of the lithium ion secondary battery which is a target include a lithium transition metal composite oxide. Examples of the lithium transition metal composite oxide include a material (cobalt material) containing a large amount of cobalt as a transition metal, a material (nickel material) containing a large amount of nickel as a transition metal, a material (ternary material) containing nickel, cobalt, and manganese as transition metals, and a manganese-spinel material, so-called, an olivine material. Examples of a negative electrode active material of the lithium ion secondary battery which is a target include a carbon negative electrode material such as amorphous natural graphite or graphite, and lithium titanate.

What is claimed is:

1. A deterioration degree calculating method for a lithium ion secondary battery comprising:
   a) storing a first data table, a second data table, and a third data table in a control device,
   the first data table containing a relationship between a temperature, a SOC, and a deterioration degree of a positive electrode per unit time regarding the lithium ion secondary battery,
   the second data table containing a relationship between a temperature, a SOC, and a deterioration degree of a negative electrode per unit time regarding the lithium ion secondary battery, and
   the third data table containing a relationship between a temperature, a SOC, and an amount of lithium trapped per unit time regarding the lithium ion secondary battery;
   b) recording a temperature history of the lithium ion secondary battery in the control device;
   c) recording a SOC history of the lithium ion secondary battery in the control device;
   d) calculating a deterioration degree of the positive electrode of the lithium ion secondary battery based on the temperature history, the SOC history, and the first data table;
   e) calculating a deterioration degree of the negative electrode of the lithium ion secondary battery based on the temperature history, the SOC history, and the second data table;
   f) calculating an amount of lithium trapped in the lithium ion secondary battery based on the temperature history, the SOC history, and the third data table; and
   g) calculating a deterioration degree of the lithium ion secondary battery based on the deterioration degree of the positive electrode, the deterioration degree of the negative electrode, and the amount of lithium trapped.

2. The deterioration degree calculating method for a lithium ion secondary battery according to claim 1 wherein the step g) includes calculating an estimated shift amount between a positive electrode potential and a negative electrode potential based on the amount of lithium trapped.

3. The deterioration degree calculating method for a lithium ion secondary battery according to claim 1 wherein
the step g) includes estimating a battery capacity of the lithium ion secondary battery after deterioration based on the deterioration degree of the positive electrode, the deterioration degree of the negative electrode, and the amount of lithium trapped, and
in the step g), the deterioration degree of the lithium ion secondary battery is calculated by dividing the battery capacity after deterioration by an initial battery capacity.

4. A control method for a lithium ion secondary battery comprising:
a) storing a first data table, a second data table, and a third data table in a control device,
the first data table containing a relationship between a temperature, a SOC, and a deterioration degree of a positive electrode per unit time regarding the lithium ion secondary battery,
the second data table containing a relationship between a temperature, a SOC, and a deterioration degree of a negative electrode per unit time regarding the lithium ion secondary battery, and
the third data table containing a relationship between a temperature, a SOC, and an amount of lithium trapped per unit time regarding the lithium ion secondary battery;
b) recording a temperature history of the lithium ion secondary battery in the control device;
c) recording a SOC history of the lithium ion secondary battery in the control device;
d) calculating a deterioration degree of the positive electrode of the lithium ion secondary battery based on the temperature history, the SOC history, and the first data table;
e) calculating a deterioration degree of the negative electrode of the lithium ion secondary battery based on the temperature history, the SOC history, and the second data table;
f) calculating an amount of lithium trapped in the lithium ion secondary battery based on the temperature history, the SOC history, and the third data table;
g) calculating a deterioration degree of the lithium ion secondary battery based on the deterioration degree of the positive electrode, the deterioration degree of the negative electrode, and the amount of lithium trapped; and
h) controlling the lithium ion secondary battery based on the deterioration degree of the lithium ion secondary battery.

5. The control method for a lithium ion secondary battery according to claim 4 wherein
the step g) includes calculating an estimated shift amount between a positive electrode potential and a negative electrode potential based on the amount of lithium trapped.

6. The control method for a lithium ion secondary battery according to claim 4 wherein
the step g) includes estimating a battery capacity of the lithium ion secondary battery after deterioration based on the deterioration degree of the positive electrode, the deterioration degree of the negative electrode, and the amount of lithium trapped, and
in the step g), the deterioration degree of the lithium ion secondary battery is calculated by dividing the battery capacity after deterioration by an initial battery capacity.

7. The control method for a lithium ion secondary battery according to claim 4 wherein
the step h) includes suppressing a current value applied to the lithium ion secondary battery in a case where the deterioration degree of the positive electrode exceeds a predetermined threshold or in a case where the deterioration degree of the negative electrode exceeds a predetermined threshold.

8. The control method for a lithium ion secondary battery according to claim 4 wherein
the step h) includes stopping application of a current value to the lithium ion secondary battery based on the amount of lithium trapped in a case where the amount of lithium trapped exceeds a predetermined threshold.

9. A control device for a lithium ion secondary battery comprising:
a temperature sensor that detects a temperature of a lithium ion secondary battery and outputs a detection result; and
one or more processors programmed to:
detect a SOC of the lithium ion secondary battery,
record a temperature history, which is based on the temperature detected by the temperature sensor,
record a SOC history, which is based on the SOC detected by the SOC detecting unit,
calculate a deterioration degree of a positive electrode of the lithium ion secondary battery based on the temperature history and the SOC history,
calculate a deterioration degree of a negative electrode of the lithium ion secondary battery based on the temperature history and the SOC history,
calculate an amount of lithium trapped in the lithium ion secondary battery based on the temperature history and the SOC history,
calculate a deterioration degree of the lithium ion secondary battery based on the deterioration degree of the positive electrode, the deterioration degree of the negative electrode, and the amount of lithium trapped, and
output the deterioration degree of the lithium ion secondary battery.

10. The control device for a lithium ion secondary battery according to claim 9 wherein
the one or more processors are further programmed to suppress a current value applied to the lithium ion secondary battery in a case where the deterioration degree of the positive electrode exceeds a predetermined threshold or in a case where the deterioration degree of the negative electrode exceeds a predetermined threshold.

11. The control device for a lithium ion secondary battery according to claim 10 wherein
the one or more processors are further programmed to:
store a data table that contains in advance a relationship between the deterioration degree of the positive electrode, the deterioration degree of the negative electrode, and a coefficient for suppressing a current value applied to the lithium ion secondary battery, and
calculate a current value applied to the lithium ion secondary battery based on the deterioration degree of the positive electrode and the deterioration degree of the negative electrode.

12. The control device for a lithium ion secondary battery according to claim 9 wherein
the one or more processors are further programmed to stop application of a current value to the lithium ion secondary battery based on the amount of lithium trapped in a case where the amount of lithium trapped exceeds a predetermined threshold.

* * * * *